US010608207B2

(12) United States Patent
Ju et al.

(10) Patent No.: US 10,608,207 B2
(45) Date of Patent: Mar. 31, 2020

(54) ORGANIC LIGHT-EMITTING DIODE DISPLAY DEVICE INCLUDING A THIN FILM ENCAPSULATION LAYER

(71) Applicant: SAMSUNG DISPLAY CO., LTD., Yongin-si, Gyeonggi-do (KR)

(72) Inventors: Yongchan Ju, Yongin-si (KR); Yisu Kim, Seoul (KR); Eungseok Park, Seoul (KR); Wonmin Yun, Suwon-si (KR); Byoungduk Lee, Seongnam-si (KR); Yoonhyeung Cho, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 201 days.

(21) Appl. No.: 15/704,218

(22) Filed: Sep. 14, 2017

(65) Prior Publication Data

US 2018/0083227 A1  Mar. 22, 2018

(30) Foreign Application Priority Data

Sep. 20, 2016  (KR) .................. 10-2016-0120123

(51) Int. Cl.
*H01L 51/50* (2006.01)
*H01L 51/52* (2006.01)
*H01L 51/00* (2006.01)
*H01L 27/32* (2006.01)

(52) U.S. Cl.
CPC ........ *H01L 51/5265* (2013.01); *H01L 51/004* (2013.01); *H01L 51/0035* (2013.01); *H01L 51/0037* (2013.01); *H01L 51/0059* (2013.01); *H01L 51/0067* (2013.01); *H01L 51/0072* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5218* (2013.01); *H01L 51/5234* (2013.01); *H01L 51/5253* (2013.01); *H01L 51/5275* (2013.01); *H01L 27/3244* (2013.01); *H01L 51/5256* (2013.01); *H01L 2251/5315* (2013.01)

(58) Field of Classification Search
None
See application file for complete search history.

(56) References Cited

U.S. PATENT DOCUMENTS

| 8,525,154 | B2 | 9/2013 | Kim et al. |
| 2011/0163330 | A1 | 7/2011 | Kim et al. |
| 2016/0343990 | A1 | 11/2016 | Song |

FOREIGN PATENT DOCUMENTS

| KR | 10-2006-0042728 | 5/2006 |
| KR | 10-2009-0128237 | 12/2009 |
| KR | 10-2011-0080050 | 7/2011 |
| KR | 10-2014-0064349 | 5/2014 |
| KR | 10-2015-0012125 | 2/2015 |

*Primary Examiner* — Gregory D Clark
(74) *Attorney, Agent, or Firm* — F. Chau & Associates, LLC

(57) ABSTRACT

A display device includes: a substrate; an organic light-emitting diode positioned above the substrate; and a thin film encapsulation layer disposed on the organic light-emitting diode. The thin film encapsulation layer includes: at least one inorganic layer; and at least one organic layer disposed on the at least one inorganic layer. The at least one organic layer has a refractive index of about 1.66 or greater.

19 Claims, 10 Drawing Sheets

ORGANIC LIGHT-EMITTING DIODE DISPLAY DEVICE INCLUDING A THIN FILM ENCAPSULATION LAYER

CROSS-REFERENCE TO RELATED APPLICATION

This application claims priority under 35 U.S.C. § 119 to Korean Patent Application No. 10-2016-0120123, filed on Sep. 20, 2016 in the Korean Intellectual Property Office, the disclosure of which is incorporated by reference herein in its entirety.

TECHNICAL FIELD

Exemplary embodiments of the present invention relate to a display device, and more particularly to an organic light-emitting diode ("OLED") display device including a thin film encapsulation layer, the thin film encapsulation layer.

DISCUSSION OF RELATED ART

An organic light-emitting diode ("OLED") display device may be a self-luminous display device, for example, that displays an image using an OLED emitting light. OLED display devices may have high quality characteristics such as a relatively low power consumption, a relatively high luminance, and a relatively high reaction speed.

The OLED display devices may have a multi-layered structure. The multi-layered structure may include an OLED. Due to such a structure, light emitted from the OLED may be extinguished when emitted to the outside. Thus, the OLED display device may have a relatively low luminous efficiency.

SUMMARY

Exemplary embodiments of the present invention provide a display device, and more particularly an organic light-emitting diode display device. The organic light-emitting diode display device may have a relatively low light emission deviation and relatively high light emission characteristics.

Exemplary embodiments of the present invention provide an organic light-emitting diode display device includes a substrate, an organic light-emitting diode, and a thin film encapsulation layer. The organic light-emitting diode is positioned above the substrate. The thin film encapsulation layer is disposed on the organic light-emitting diode. The thin film encapsulation layer includes at least one inorganic layer and at least one organic layer. The at least one inorganic layer is disposed on the at least one inorganic layer. The at least one organic layer has a refractive index of about 1.66 or greater.

The at least one inorganic layer and the at least one organic layer may have a refractive index difference of about 0.06 or less.

The at least one organic layer may have a refractive index in a range of from about 1.66 to about 2.8.

The at least one inorganic layer may have a refractive index in a range of from about 1.6 to about 2.8.

The organic layer may be formed by polymerization of at least one monomer selected from: pentabromophenyl acrylate, 2-(9H-carbazol-9-yl) ethyl methacrylate, N-vinylcarbazole, bis(methacryloylthiophenyl) sulfide or zirconium acrylate.

The organic layer may include at least one selected from: poly(3,4-ethylenedioxythiophene) (PEDOT), 4,4'-bis[N-(3-methylphenyl)-N-phenylamino]biphenyl (TPD), 4,4',4"-tris[(3-methylphenyl)phenylamino]triphenylamine (m-MTDATA), 1,3,5-tris [N,N-bis(2-methylphenyl)-amino]benzene (o-MTDAB), 1,3,5-tris[N,N-bis(3-methylphenyl)-amino]benzene (m-MTDAB), 1,3,5-tris [N,N-bis(4-methylphenyl)amino]benzene (p-MTDAB), 4,4'-bis[N, N-bis(3-methylphenyl)-amino]diphenylmethane (BPPM), 4,4-dicarbazolyl-1,1'-biphenyl (CBP), 4,4',4"-tris(N-carbazole) triphenylamine (TCTA), 2,2',2"-(1,3,5-benzenetolyl) tris-[1-phenyl-1H-benzoimidazol] (TPBI) or 3-(4-biphenyl)-4-phenyl-5-t-butylphenyl-1,2,4-triazole (TAZ).

The at least one inorganic layer may include a first inorganic layer and a second inorganic layer. The at least one organic layer may include a first organic layer disposed between the first inorganic layer and the second inorganic layer.

The organic light-emitting diode may include a first electrode, an organic light-emitting layer, and a second electrode. The first electrode may be disposed on the substrate. The organic light-emitting layer may be disposed on the first electrode. The second electrode may be disposed on the organic light-emitting layer.

The organic light-emitting diode may include at least one of a hole injection layer and a hole transport layer disposed between the first electrode and the organic light emitting layer.

The organic light-emitting diode may include at least one of an electron transport layer and an electron injection layer disposed between the organic light emitting layer and the second electrode.

The organic light-emitting diode display device may further include a capping layer disposed between the organic light-emitting diode and the thin film encapsulation layer.

The organic light-emitting diode display device may further include a low refractive index layer disposed between the capping layer and the thin film encapsulation layer.

The low refractive index layer may have a refractive index in a range of from about 1.3 to about 1.4.

The low refractive index layer may include lithium fluoride (LiF).

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
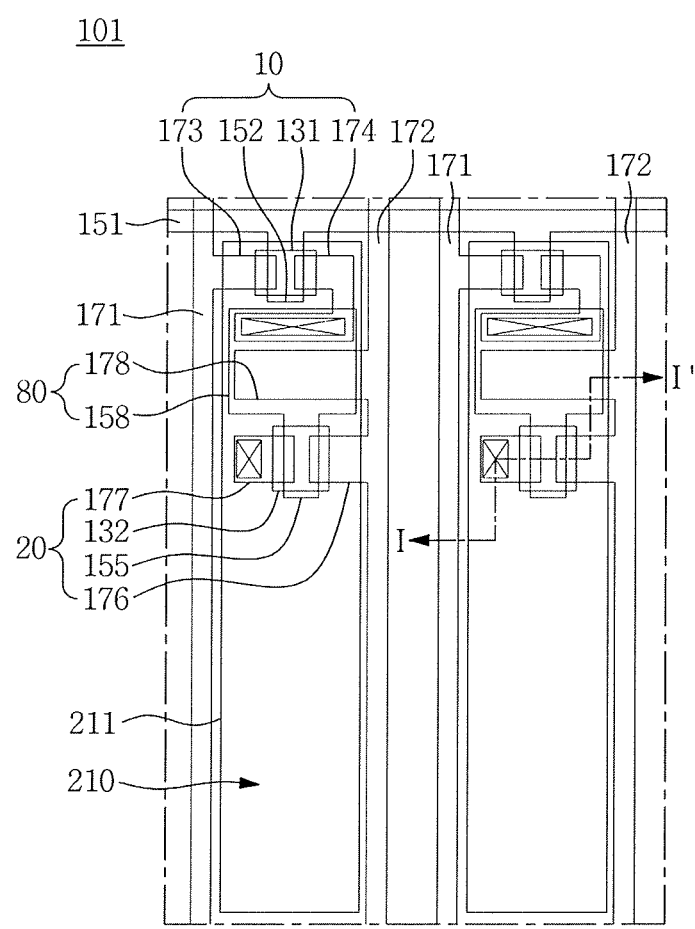
FIG. 1 is a plan view illustrating an organic light-emitting diode ("OLED") display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

Hereinafter, exemplary embodiments of the present invention will be described with reference to FIGS. 1 and 2.

FIG. 1 is a plan view illustrating an organic light-emitting diode ("OLED") display device according to an exemplary embodiment of the present invention. FIG. 2 is a cross-sectional view taken along a line I-I' of FIG. 1 according to an exemplary embodiment of the present invention.

Figure 2:
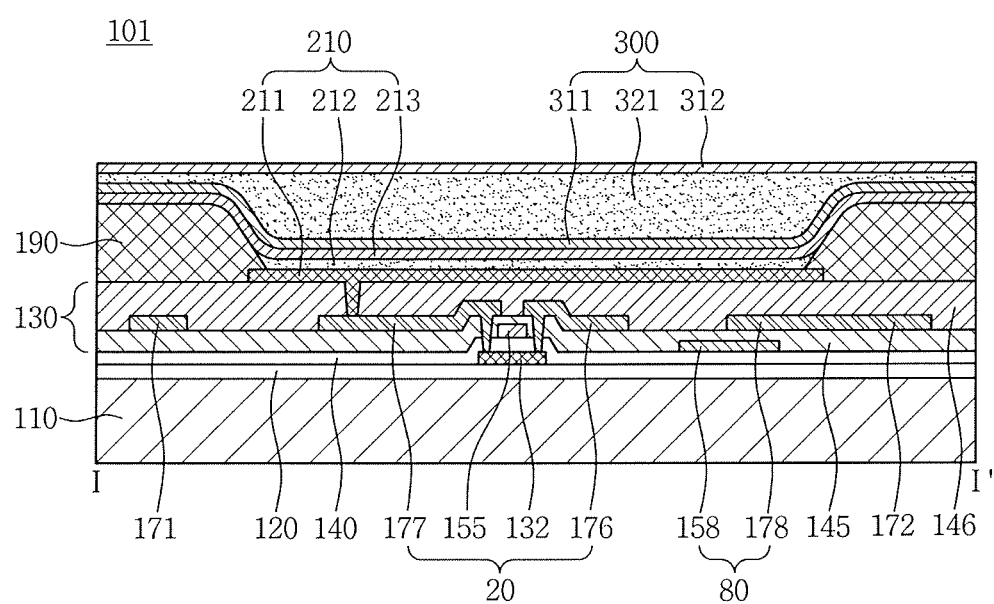
FIG. 2 is a cross-sectional view taken along a line I-I' of FIG. 1 according to an exemplary embodiment of the present invention.

Referring to FIGS. 1 and 2, an OLED display device 101 according to an exemplary embodiment of the present invention may include a substrate 110, a wiring unit 130, an OLED 210, and a thin film encapsulation layer 300.

The substrate 110 may include an insulating material. The insulating material may include glass, quartz, ceramic, or plastic. However, exemplary embodiments of the present invention are not limited thereto. For example, the substrate 110 may include a metallic material such as stainless steel.

A buffer layer 120 may be disposed on the substrate 110. The buffer layer 120 may include one or more layers selected from various inorganic layers or organic layers. The buffer layer 120 may substantially reduce or prevent undesirable elements, e.g., impurity elements or moisture, from penetrating into the wiring unit 130 or the OLED 210. The buffer layer 120 may planarize a surface therebelow. The buffer layer 120 may be omitted.

The wiring unit 130 may be positioned above the buffer layer 120. The wiring unit 130 may include a switching thin film transistor ("TFT") 10, a driving TFT 20 and a capacitor 80. The wiring unit 130 may drive the OLED 210. The OLED 210 may emit light, for example, according to a driving signal received from the wiring unit 130 to display an image.

FIGS. 1 and 2 illustrate an active matrix-type organic light-emitting diode (AMOLED) display device 101 having a 2Tr-1 Cap structure. For example, the 2Tr-1 Cap structure may include two TFTs, e.g., the switching TFT 10 and the driving TFT 20, and one capacitor 80 in each pixel; however, exemplary embodiments of the present invention are not limited thereto. For example, the OLED display device 101 may include three or more TFTs and two or more capacitors in each pixel. The OLED display device 101 may include additional wirings. Herein, the term "pixel" may refer to a smallest unit for displaying an image. The OLED display device 101 may display an image using a plurality of pixels.

Each pixel PX may include the switching TFT 10, the driving TFT 20, the capacitor 80, and the OLED 210. A gate line 151, a data line 171, and a common power line 172 may be disposed on the wiring unit 130. The gate line 151 may extend in a first direction. The data line 171 and the common power line 172 may each be insulated from the gate line 151. The data line 171 and the common power line 172 may intersect the gate line 151. Each pixel PX may be defined by the gate line 151, the data line 171 and the common power line 172 as a boundary; however, exemplary embodiments of the present invention are not limited thereto. The pixels PX may be defined by a pixel defining layer 190.

The capacitor 80 may include a pair of capacitor plates 158 and 178. An insulating interlayer 145 may be disposed between the pair of capacitor plates 158 and 178. In an exemplary embodiment of the present invention, the insulating interlayer 145 may be a dielectric element. A capacitance of the capacitor 80 may be determined by electric charges accumulated in the capacitor 80 and a voltage across the pair of capacitor plates 158 and 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177. A gate insulating layer 140 may be disposed on the buffer layer 110. The gate insulating layer 140 may insulate the switching and driving semiconductor layers 131 and 132 and the switching and driving gate electrodes 152 and 155.

The switching TFT 10 may be a switching element. The switching TFT 10 may select a pixel to perform light emission. The switching gate electrode 152 may be connected to the gate line 151. The switching source electrode 173 may be connected to the data line 171. The switching drain electrode 174 may be spaced apart from the switching source electrode 173. The switching drain electrode 174 may be connected to at least one of the capacitor plates 158 or 178, e.g., the capacitor plate 158.

The driving TFT 20 may apply a driving power to a first electrode 211. Thus, an organic light-emitting layer 212 of an OLED 210 in a selected pixel may emit light. The driving gate electrode 155 may be connected to the capacitor plate 158 connected to the switching drain electrode 174. Each of the driving source electrode 176 and the other of the capacitor plates, e.g., the capacitor plate 178, may be connected to the common power line 172. The driving drain electrode 177 may be connected to the first electrode 211 of the OLED 210, for example, through a contact hole.

The switching TFT 10 may be driven according to, for example, a gate voltage applied to the gate line 151. The switching TFT 10 may transmit a data voltage applied to the data line 171 to the driving TFT 20. A voltage equivalent to a difference between a common voltage applied to the driving TFT 20 from the common power line 172 and the data voltage transmitted by (or from) the switching TFT 10 may be stored in the capacitor 80. A current corresponding to the voltage stored in the capacitor 80 may flow to the OLED 210 through the driving TFT 20. Thus, the OLED 210 may emit light.

A planarization layer 146 may be disposed on the insulating interlayer 145. The planarization layer 146 may include an insulating material. The planarization layer 146 may protect the wiring unit 130. The planarization layer 146 and the insulating interlayer 145 may include a same material as each other.

The OLED 210 may be disposed on the planarization layer 146. The OLED 210 may include a first electrode 211, the organic light-emitting layer 212, and a second electrode 213. The organic light-emitting layer 212 may be disposed on the first electrode 211. The second electrode 213 may be disposed on the organic light-emitting layer 212. Holes and electrons may be injected into the organic light-emitting layer 212 from the first electrode 211 and the second electrode 213, respectively. The holes and electrons may be combined in the organic light-emitting later 212 and may form excitons. The OLED 210 may emit light when the excitons fall from an excited state to a ground state.

According to an exemplary embodiment of the present invention, the first electrode 211 may be an anode for injecting holes. The second electrode 213 may be a cathode for injecting electrons. However, exemplary embodiments of the present invention are not limited thereto. For example, the first electrode 211 may be a cathode, and the second electrode 213 may be an anode.

According to an exemplary embodiment of the present invention, the first electrode 211 may be a reflective film. The second electrode 213 may be a semi-transmissive film. Accordingly, a light generated in the organic light-emitting layer 212 may be emitted through the second electrode 213. Thus, the OLED display device 101 according to an exemplary embodiment of the present invention may have a top emission type structure.

The first electrode 211 may have a structure in which, for example, a reflective film and a transparent conductive film are sequentially stacked. In such an exemplary embodiment of the present invention, the transparent conductive film of the first electrode 211 may be disposed between the reflective film and the organic light-emitting layer 212.

The reflective film may include one or more metals selected from: magnesium (Mg), silver (Ag), gold (Au), calcium (Ca), lithium (Li), chromium (Cr), copper (Cu), oraluminum (Al). The reflective film may have a thickness of about 200 nm or greater.

The transparent conductive film may include a transparent conductive oxide (TCO). The TCO may include: indium tin oxide (ITO), indium zinc oxide (IZO), zinc oxide (ZnO), aluminum zinc oxide (AZO), or indium oxide ($In_2O_3$). The transparent conductive film may have a relatively high work function. Thus, hole injection through the first electrode 211 may be performed with relative ease.

The first electrode 211 may have a triple-layer structure in which a transparent conductive film, a reflective film and a transparent conductive film are sequentially stacked.

The second electrode 213 may include a semi-transmissive film. The semi-transmissive film may include one or more metals selected from magnesium (Mg), silver (Ag), gold (Au), calcium (Ca), lithium (Li), chromium (Cr), copper (Cu), or aluminum (Al). The semi-transmissive film may have a thickness of about 200 nm or less. As the thickness of the semi-transmissive film decreases, the transmittance of light may increase. As the thickness of the semi-transmissive film increases, the transmittance of light may decrease.

The organic light-emitting layer 212 may include a single molecule organic material or a polymer organic material. The organic light-emitting layer 212 may be formed by any known method using an organic light emitting material.

The pixel defining layer 190 may have an opening. The opening of the pixel defining layer 190 may expose a portion of the first electrode 211. The organic light-emitting layer 212 and the second electrode 213 may be sequentially stacked on the first electrode 211 exposed by the opening. The second electrode 213 may be disposed on the pixel defining layer 190 and the organic light emitting layer 212. The OLED 210 may emit light, for example, from the organic light-emitting layer 212 at the opening of the pixel defining layer 190. Thus, the pixel defining layer 190 may define a light emission area.

The thin film encapsulation layer 300 may be disposed on the second electrode 213, for example, to protect the OLED 210. The thin film encapsulation layer 300 may reduce or prevent outside air such as moisture or oxygen from permeating into the OLED 210.

For example, the thin film encapsulation layer 300 may include at least one inorganic layer 311 or 312 and at least one organic layer 321. The at least one inorganic layer 311 or 312 and the at least one organic layer 321 may be alternately disposed.

According to an exemplary embodiment of the present invention, the at least one organic layer 321 may have a refractive index of about 1.66 or greater. For example, the at least one organic layer 321 may have a refractive index ranging from about 1.66 to about 2.8. The at least one inorganic layer 311 and 312 may have a refractive index ranging from about 1.6 to about 2.8.

The at least one inorganic layer 311 and 312 and the at least one organic layer 321 may have a refractive index difference of about 0.06 or less. When the refractive index difference is relatively small, light reflection at an interfacial surface between the at least one inorganic layer 311 and 312 and the at least one organic layer 321 may be reduced or prevented. Accordingly, optical resonance in the OLED display device 101 may be reduced or prevented, and a luminance deviation due to optical resonance may be reduced or prevented. The optical resonance will be described in more detail below.

Referring to FIG. 2, the thin film encapsulation layer 300 may include two inorganic layers 311 and 312 and one organic layer 321. For example, the at least one inorganic layer may include a first inorganic layer 311 and a second inorganic layer 312. The at least one organic layer may include a first organic layer 321. The first inorganic layer 321 may be disposed between the first inorganic layer 311 and the second inorganic layer 312. The at least one inorganic layer 311 and 312 may be referred to as an inorganic layer 311 and 312. The at least one organic layer 321 may be referred to as an organic layer 321. However, exemplary embodiments of the present invention are not limited to the structure described with reference to FIG. 2.

According to an exemplary embodiment of the present invention, the inorganic layer 311 and 312 may have a thickness in a range of from about 100 nm to about 1,000 nm. The inorganic layer 311 and 312 may include at least one of silver, metal oxide, metal oxynitride, silicon oxide, silicon nitride, or silicon oxynitride. The inorganic layer 311 and 312 may have substantially a same refractive index as each other. The inorganic layers 311 and 312 may have substantially a same thickness as each other. The inorganic layers 311 and 312 may include a same material as each other.

For example, the inorganic layer 311 and 312 may include one or more inorganic materials of: $Al_xO_y$, $TiO_x$, $ZrO_x$, $SiO_x$, $AlO_xN_y$, $Al_xN_y$, $SiO_xN_y$, $Si_xN_y$, $ZnO_x$ or $Ta_xO_y$. For example, the inorganic layer 311 and 312 may include one or more inorganic materials of: $Al_2O_3$, $TiO_2$, $ZrO$, $SiO_2$, AlON, AlN, SiON, $Si_3N_4$, ZnO or $Ta_2O$. The inorganic layer 311 and 312 may be formed through methods such as a chemical vapor deposition (CVD) method or an atomic layer deposition (ALD) method. However, exemplary embodiments of the present invention are not limited thereto. For example, the inorganic layer 311 and 312 may be formed through various methods.

The organic layer 321 may have a thickness in a range of from about 100 nm to about 8,000 nm. According to an exemplary embodiment of the present invention, the organic layer 321 may include an organic material having a relatively high refractive index. For example, the organic layer 321 may include a polymer material having a relatively high refractive index.

According to an exemplary embodiment of the present invention, the organic layer 321 may be formed by polymerization of at least one monomer selected from the following Chemical Formulae 1, 2, 3, 4 and 5.

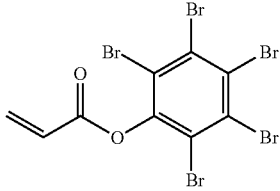

[Chemical Formula 1]

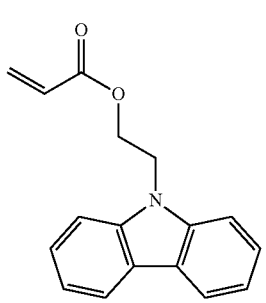

[Chemical Formula 2]

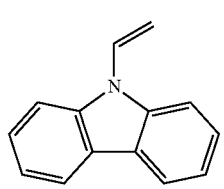

[Chemical Formula 3]

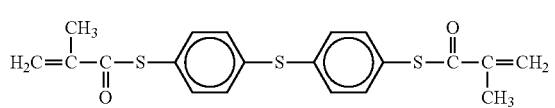

[Chemical Formula 4]

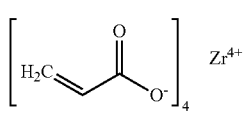

[Chemical Formula 5]

Thus, the organic layer 321 may be formed by polymerization of at least one monomer selected from: pentabromophenyl acrylate, 2-(9H-carbazol-9-yl) ethyl methacrylate, N-vinylcarbazole, bis (methacryloylthiophenyl) sulfide or zirconium acrylate.

For example, the organic layer 321 may be formed by depositing, on the inorganic layer 311 or 312, at least one monomer selected from: pentabromophenyl acrylate, 2-(9H-carbazol-9-yl) ethyl methacrylate, N-vinylcarbazole, bis (methacryloylthiophenyl) sulfide or zirconium acrylate.

The organic layer 321 including pentabromophenyl acrylate represented by Chemical Formula 1 may have a refractive index of about 1.7.

The organic layer 321 including 2-(9H-carbazol-9-yl) ethyl methacrylate represented by Chemical Formula 2 may have a refractive index of about 1.69.

The organic layer 321 including N-vinylcarbazole represented by Chemical Formula 3 may have a refractive index of about 1.68.

The organic layer 321 including bis (methacryloylthiophenyl) sulfide represented by Chemical Formula 4 may have a refractive index of about 1.66.

The organic layer 321 including zirconium acrylate represented by Chemical Formula 5 may have a refractive index of about 1.66. The refractive index of the organic layer 321 may be adjusted, for example, by adjusting the content of zirconium (Zr).

The organic layer 321 may include an acrylic resin, an epoxy resin, polyimide or polyethylene, which are polymer-based materials. For example, according to an exemplary embodiment of the present invention, the organic layer 321 may include at least one selected from: poly(3,4-ethylenedioxythiophene) (PEDOT), 4,4'-bis[N-(3-methylphenyl)-N-phenylamino]biphenyl (TPD), 4,4',4"-tris[(3-methylphenyl) phenylamino]triphenylamine (m-MTDATA), 1,3,5-tris [N,N-bis(2-methylphenyl)-amino]benzene (o-MTDAB), 1,3,5-tris[N,N-bis(3-methylphenyl)-amino]benzene (m-MTDAB), 1,3,5-tris[N,N-bis (4-methylphenyl)amino] benzene (p-MTDAB), 4,4'-bis[N,N-bis(3-methylphenyl)-amino]diphenylmethane (BPPM), 4,4-dicarbazolyl-1,1'-biphenyl (CBP), 4,4',4"-tris(N-carbazole) triphenylamine (TCTA), 2,2',2"-(1,3,5-benzenetolyl)tris-[1-phenyl-1H-benzoimidazol] (TPBI) or 3-(4-biphenyl)-4-phenyl-5-t-butylphenyl-1,2,4-triazole (TAZ).

The organic layer 321 may be formed, for example, through a thermal deposition process. The thermal deposition process may be performed within a temperature range that does not damage the OLED 210. However, exemplary embodiments of the present invention are not limited thereto. For example, the organic layer 321 may be formed through various methods.

The inorganic layer 311 or 312 may have a relatively high density of thin film. Thus, the inorganic layer 311 or 312 may substantially reduce or prevent permeation of, for example, moisture or oxygen. Permeation of moisture and oxygen into the OLED 210 may be reduced or prevented by the inorganic layer 311 or 312.

Moisture and oxygen that have passed through the inorganic layer 311 or 312 may be substantially blocked by the organic layer 321. The organic layer 321 may have a relatively low moisture-infiltration preventing efficacy, as compared to the inorganic layer 311 and 312. However, the organic layer 321 may be a buffer layer. Thus, the organic layer 321 may reduce stress among respective ones of the inorganic layer 311 and 312. The organic layer 321 may also have a moisture-infiltration preventing function. Further, since the organic layer 321 may have planarization characteristics, an uppermost surface of the thin film encapsulation layer 300 may be planarized by the organic layer 321.

The thin film encapsulation layer 300 may have a thickness of about 50 Lm or less, e.g., about 10 m or less. Accordingly, the OLED display device 101 may have a relatively small thickness. Thus, the OLED display device 101 may have a relatively high flexibility.

Figure 3:
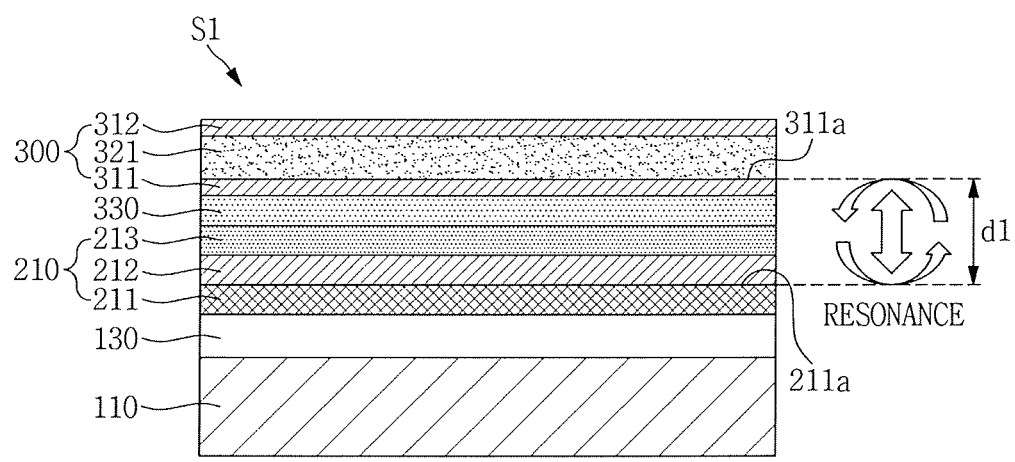
FIG. 3 is a cross-sectional view illustrating resonance in an OLED display device according to an exemplary embodiment of the present invention.

FIG. 3 is a cross-sectional view illustrating resonance in an OLED display device according to an exemplary embodiment of the present invention. Referring to FIG. 3, an intermediate layer 330 may be disposed between the OLED 210 and the thin film encapsulation layer 300. The intermediate layer 330 may include a light-transmitting material. The intermediate layer 330 may have a single-layered structure. Alternatively, the intermediate layer 330 may have a multi-layered structure in which a plurality of layers are stacked. The intermediate layer 330 may be omitted.

The OLED display device S1 may have a multi-layered structure. A light emitted from the organic light-emitting layer 212 may be emitted through the multi-layered structure of the OLED display device S1.

When a refractive index difference between the organic layer 321 and the inorganic layer 311 or 312 included in the thin film encapsulation layer 300 is relatively large, light may be reflected at an interfacial surface between the organic layer 321 and the inorganic layer 311 or 312. Accordingly, optical resonance may be induced by the light reflection.

Optical resonance may be referred to herein as "resonance." The resonance will be described with respect to the organic layer 321 and the first inorganic layer 311, which may be one of the inorganic layers 311 and 312 positioned closest to the OLED 210.

For example, referring to FIG. 3, the first inorganic layer 311 may have a refractive index of about 1.75. The organic layer 321 may have a refractive index of about 1.5.

When the first inorganic layer 311 has a refractive index of about 1.75 and the organic layer 321 has a refractive index of about 1.5, a refractive index difference between the first inorganic layer 311 and the organic layer 321 may be about 0.25. In such an exemplary embodiment of the present invention, an interfacial surface 311a between the first inorganic layer 311 and the organic layer 321 may be a reflective surface. The first electrode 211 of the top emission type OLED display device may be a reflective electrode. Accordingly, light may be reflected off a surface 211a of the first electrode 211.

When light repeats reflection between two reflective surfaces, optical resonance may occur. When optical resonance occurs, light energy may increase. The light having the increased energy may relatively readily pass through the multi-layered stacked structure of the OLED display device S1 to be emitted outwards. A structure allowing light resonance between two reflective layers may be referred to as a resonance structure. A distance between the two reflective layers between which resonance occurs may be referred to as a resonance distance. The resonance distance may vary, for example, based on the wavelength of light.

For example, when a wavelength of light emitted from the organic light-emitting layer 212 is "λ1" and a distance between the surface 211a of the first electrode 211 and the interfacial surface 311a between the first inorganic layer 311 and the organic layer 321 is "d1," light resonance may occur when the following Formula 1 is satisfied.

$$d1 = m1 \cdot \lambda 1 \quad \text{[Formula 1]}$$

In Formula 1, "m1" is a natural number.

According to an exemplary embodiment of the present invention, the first inorganic layer 311 may be formed through methods such as a chemical vapor deposition (CVD) method or an atomic layer deposition (ALD) method. In such an exemplary embodiment of the present invention, due to process errors, a layer thickness may vary. Thus, a layer thickness may vary, for example, based on the position in a single first inorganic layer 311.

When the layer thickness of the first inorganic layer 311 varies, a distance between the surface 211a of the first electrode 211 and the interfacial surface 311a between the first inorganic layer 311 and the organic layer 321 may vary. Thus, the wavelength of light resonated between the surface 211a of the first electrode 211 and the interfacial surface 311a between the first inorganic layer 311 and the organic layer 321 may vary.

Figure 4:
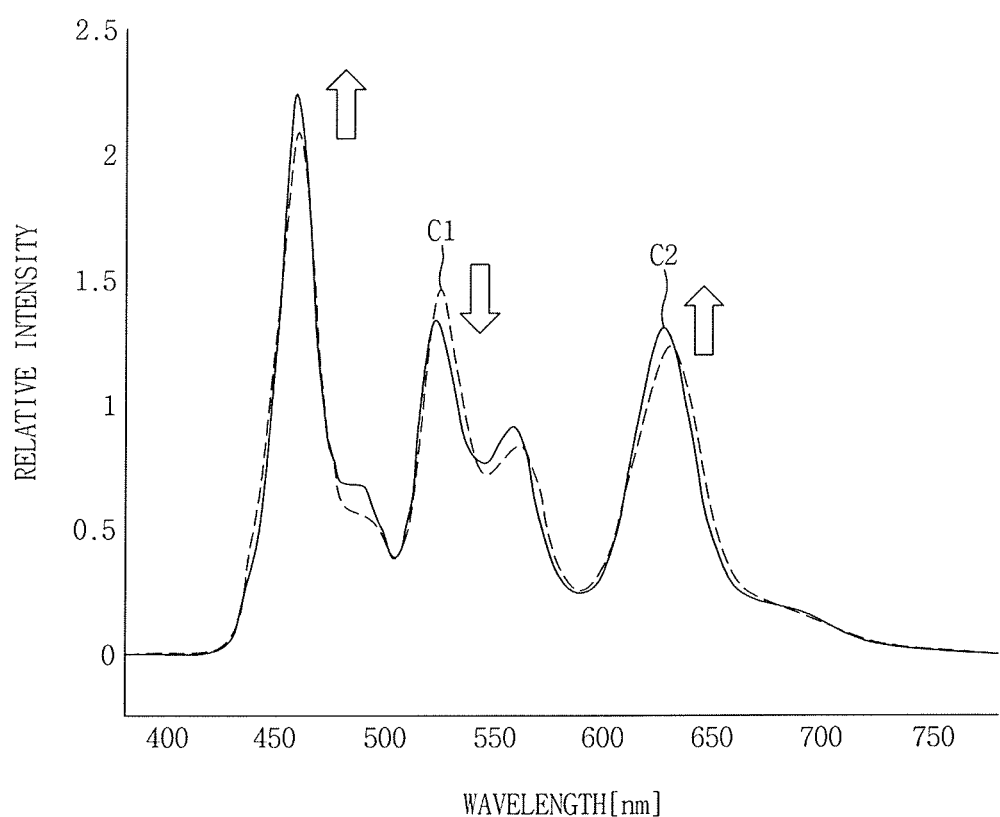
FIG. 4 is an emission spectrum graph of an OLED display device depending on a wavelength of emitted light according to an exemplary embodiment of the present invention.

FIG. 4 is an emission spectrum graph of an OLED display device according to the wavelength according to an exemplary embodiment of the present invention. In FIG. 4, C1 (represented by a dotted line) may refer to a relative luminous intensity based on the wavelength of light when the thickness of the first inorganic layer 311 is about 1 μm. C2 (represented by a bold line) may refer to a relative luminous intensity based on the wavelength of light when the thickness of the first inorganic layer 311 is about 1.05 μm. Referring to FIG. 4, although the thickness of the first inorganic layer 311 may be changed by about 0.05 μm (i.e., about 50 nm), the luminous intensity based on the wavelength of light may vary.

The OLED display device may include a plurality of pixels. Due to process errors, the first inorganic layer 311 on the OLED 210 may have different thicknesses corresponding to respective pixels. For example, when the thickness of the first inorganic layer 311 on red OLEDs R is not uniform, luminous intensity of a red color may vary corresponding to each pixel, which may be similar to a green pixel and a blue pixel.

Figure 5:
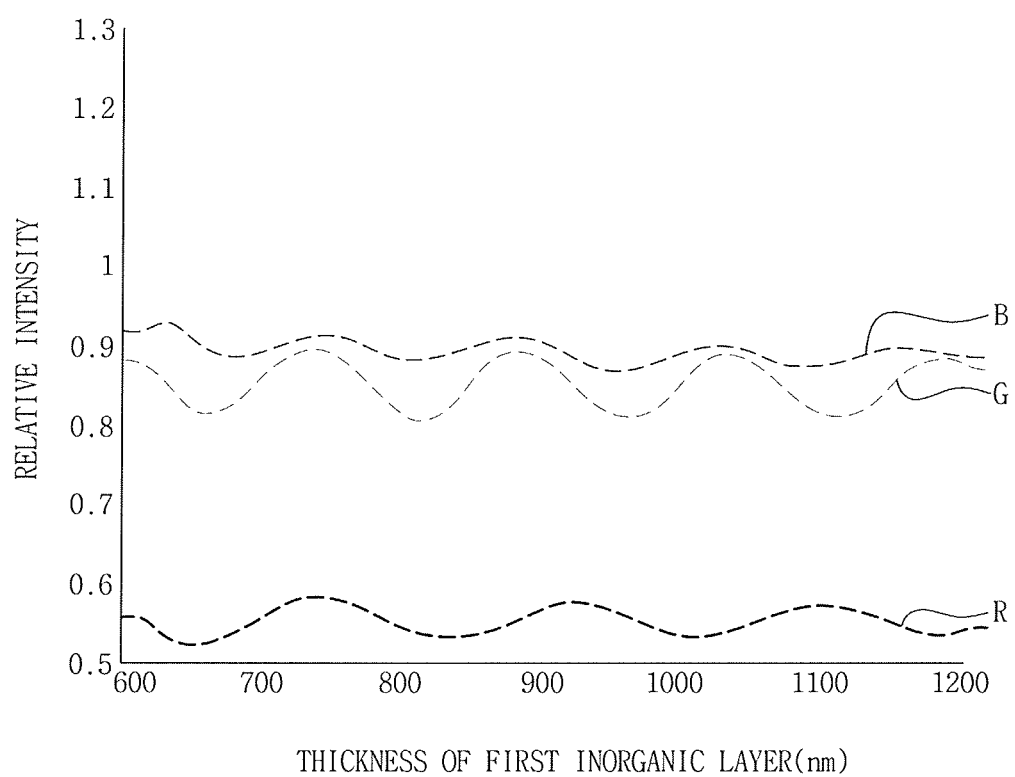
FIGS. 5 and 6 are emission spectrum graphs of an OLED display device depending on a thickness of a first inorganic layer according to an exemplary embodiment of the present invention.

FIG. 5 is an emission spectrum graph of an OLED display device according to the thickness of the first inorganic layer according to an exemplary embodiment of the present invention. Referring to FIG. 5, as the thickness of the first inorganic layer 311 varies, luminous intensities of a red color R, a green color G, and a blue color B may vary.

As such, in the case where the interfacial surface 311a between the first inorganic layer 311 and the organic layer 321 is a reflective layer, when the thickness of the first inorganic layer 311 varies, the wavelength of light resonated between the surface 211a of the first electrode 211 and the interfacial surface 311a between the first inorganic layer 311 and the organic layer 321 may vary. In such an exemplary embodiment of the present invention, a limit in forming a uniform thickness of the first inorganic layer 311 in a process of manufacturing the first inorganic layer 311 and the thickness of the first inorganic layer 311 may vary based on the position due to process errors. Accordingly, pixels representing a same color may exhibit different luminous intensities based on the position.

According to an exemplary embodiment of the present invention, at least the organic layer 321 may have a refractive index of about 1.66 or more. For example, the organic layer 321 may have a refractive index in a range of from about 1.66 to about 2.8. Accordingly, a refractive index difference between the inorganic layer 311 or 312 and the organic layer 321 may be reduced to about 0.06 or less. Thus, light reflection at the interfacial surface between the inorganic layer 311 and 312 and the organic layer 321 may be reduced or prevented.

According to an exemplary embodiment of the present invention, a refractive index difference between the first inorganic layer 311 and the organic layer 321 may be relatively small since the organic layer 321 may include a relatively high refractive index material and may have a relatively large refractive index of about 1.66 or more. Thus, the first inorganic layer 311 and the organic layer 321 may have a refractive index difference of about 0.06 or less. The first inorganic layer 311 and the organic layer 321 may have substantially a same refractive index as each other (e.g., the refractive index difference=0). Thus, light might not be reflected between the first inorganic layer 311 and the organic layer 321. Accordingly, even if the thickness of the first inorganic layer 311 varies depending on the position due to process errors, there may be substantially no deviation in luminous efficiency due to resonance of light. Even if there is a deviation in the thickness of the first inorganic layer 311, there is no deviation in the luminous intensity.

Accordingly, the OLED display device 101 according to an exemplary embodiment of the present invention may have a substantially uniform luminous efficiency for each pixel or position.

Figure 6:
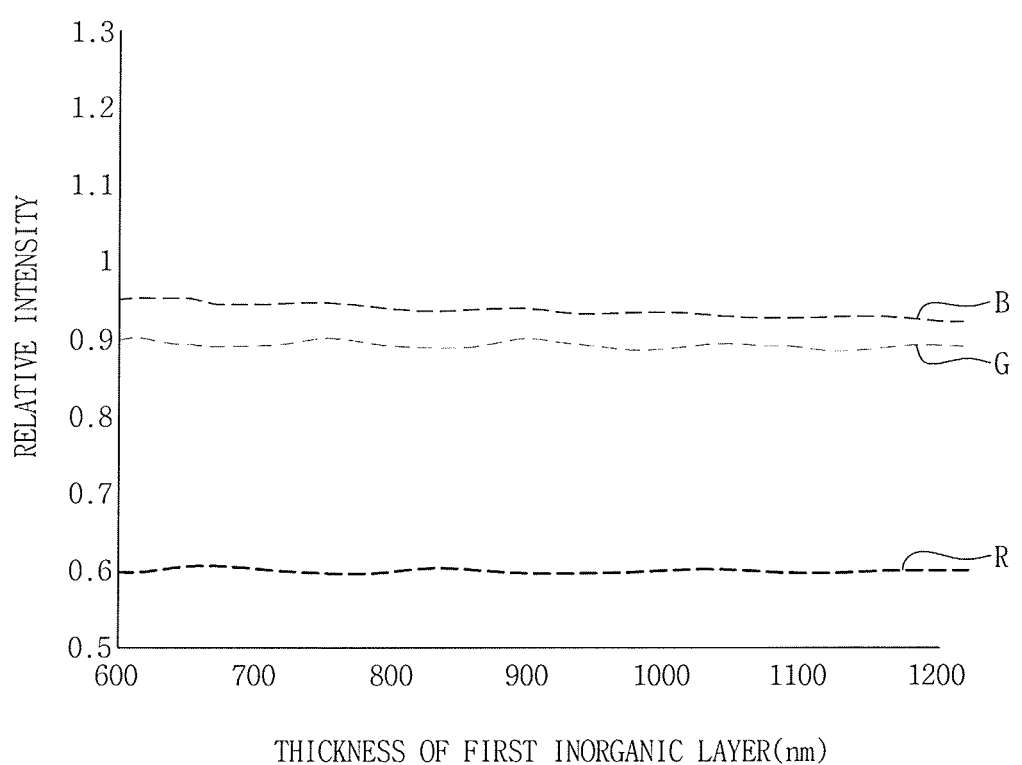

FIG. 6 is an emission spectrum graph of an OLED display device according to the thickness of the first inorganic layer according to an exemplary embodiment of the present invention. The OLED display device may refer to the OLED display device 101 according to an exemplary embodiment of the present invention.

Referring to FIG. 6, even if the thickness of the first inorganic layer 311 varies, luminous intensities of a red pixel R, a green pixel G and a blue pixel B might not substantially vary. Thus, there may be no substantial deviation in luminous intensity depending on the thickness of the first inorganic layer 311.

An exemplary embodiment of the present invention will be described in more detail below with reference to FIG. 7.

Figure 7:
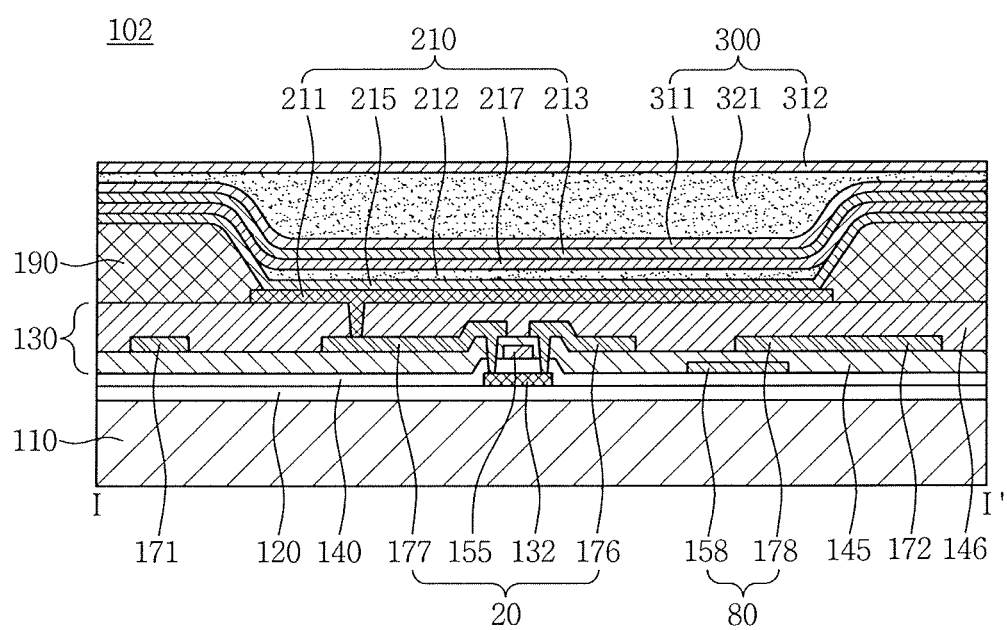
FIG. 7 is a cross-sectional view illustrating an OLED display device according to an exemplary embodiment of the present invention.

FIG. 7 is a cross-sectional view illustrating an OLED display device according to an exemplary embodiment of the present invention. Descriptions of the above-described components may be omitted below.

The OLED display device 102 according to an exemplary embodiment of the present invention may include a first light emission auxiliary layer 215. The first light emission auxiliary layer 215 may be disposed between a first electrode 211 and an organic light-emitting layer 212. The first light emission auxiliary layer 215 may include at least one of a hole injection layer HIL and a hole transport layer HTL. The first light emission auxiliary layer 215 may include the hole injection layer and the hole transport layer.

The OLED display device 102 according to an exemplary embodiment of the present invention may include a second light emission auxiliary layer 217. The second light emission auxiliary layer 217 may be disposed between the organic light emitting layer 212 and a second electrode 213. The second light emission auxiliary layer 217 may include at least one of an electron transport layer ETL and an electron injection layer EIL. The second light emission auxiliary layer 217 may include the electron injection layer EIL and the electron transport layer ETL.

The first light emission auxiliary layer 215 and the second light emission auxiliary layer 217 may each extend between a pixel defining layer 190 and the second electrode 213.

The organic light-emitting layer 212, the hole injection layer, the hole transport layer, the electron transport layer and the electron injection layer may also be referred to as an organic layer. The organic layer may include a relatively low molecular weight organic material or a relatively high molecular weight organic material.

The OLED display device 102 according to an exemplary embodiment of the present invention may include the first light emission auxiliary layer 215 or the second light emission auxiliary layer 217. Alternatively, the OLED display device 102 may include the first light emission auxiliary layer 215 and the second light emission auxiliary layer 217.

An exemplary embodiment of the present invention will be described in more detail below with reference to FIG. 8.

Figure 8:
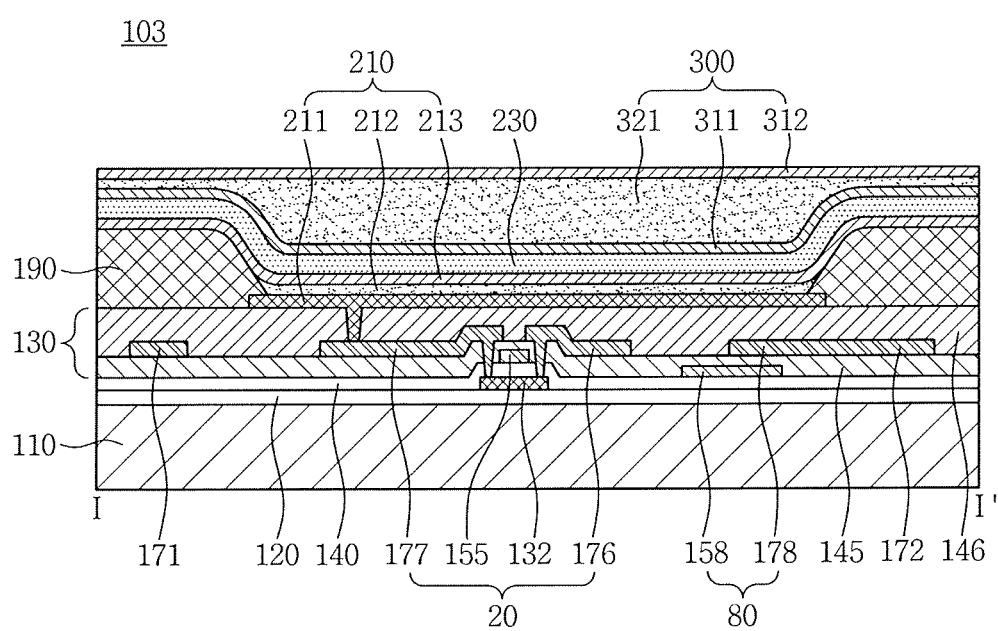
FIG. 8 is a cross-sectional view illustrating an OLED display device according to an exemplary embodiment of the present invention.

FIG. 8 is a cross-sectional view illustrating an OLED display device according to an exemplary embodiment of the present invention.

The OLED display device 103 according to an exemplary embodiment of the present invention may include a capping layer 230. The capping layer 230 may be disposed between an OLED 210 and a thin film encapsulation layer 300. Referring to FIG. 8, the capping layer 230 may be disposed between a second electrode 213 and a first inorganic layer 311.

The capping layer 230 may have optical transparency. The capping layer 230 may protect the OLED 210. The capping layer 230 may provide a light emitted from an organic light-emitting layer 212 to be emitted to the outside.

The capping layer 230 may include at least one of an inorganic material and an organic material having light transmittance. Thus, the capping layer 230 may include an inorganic layer or an organic layer. Alternatively, the capping layer 230 may include an organic layer including inorganic particles.

The capping layer 230 may include two or more materials having different refractive indices. For example, the capping layer 230 may be formed by using a mixture of a relatively high refractive index material and a relatively low refractive index material. The relatively high refractive index material and the relatively low refractive index material may be an organic material or an inorganic material, respectively.

The capping layer 230 may have a thickness in a range of from about 30 nm to about 300 nm. Alternatively, the capping layer 230 may have a thickness of about 300 nm or more. As the thickness of the capping layer 230 increases, protection of the OLED 210 may increase. However, if the capping layer 230 is relatively thick, a thickness of the OLED display device 103 may be increased.

The capping layer 230 may be prepared by various methods. For example, the capping layer 230 may be formed by a deposition process. In the deposition process, a relatively high refractive index material and a relatively low refractive index material may be used together. A deposition amount or a deposition ratio of the relatively high refractive index material and the relatively low refractive index material may be adjusted, for example, to adjust a refractive index of the capping layer 230. The capping layer 230 may have a refractive index in a range of from about 1.3 to about 1.4. For example, the capping layer 230 may have a refractive index in a range of from about 1.35 to about 1.38. For example, the capping layer 230 may have a refractive index of about 1.36.

Figure 9:
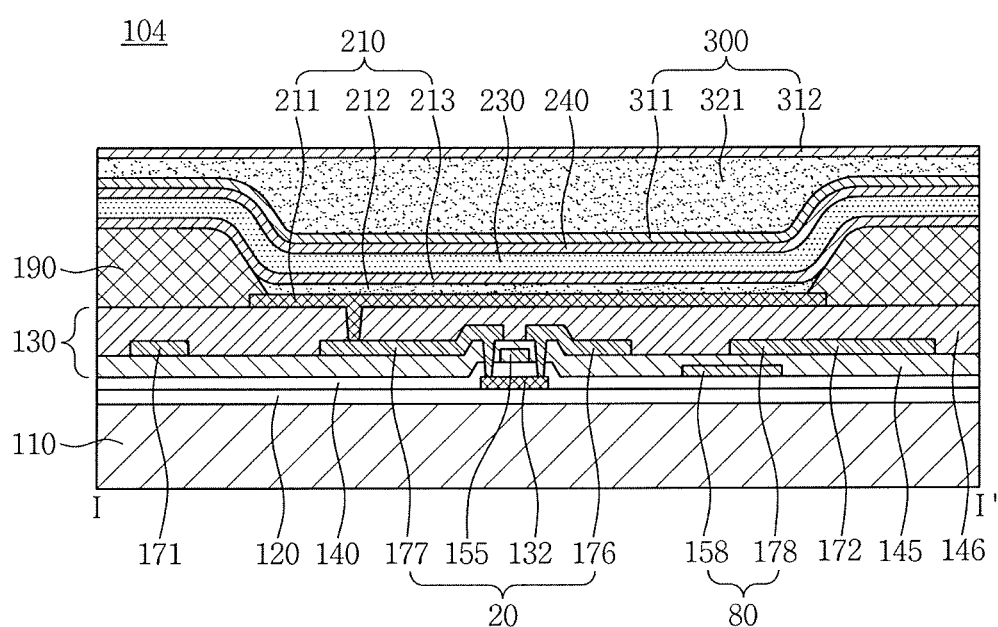
FIG. 9 is a cross-sectional view illustrating an OLED display device according to an exemplary embodiment of the present invention.

FIG. 9 is a cross-sectional view illustrating an OLED display device according to an exemplary embodiment of the present invention.

The OLED display device 104 according to an exemplary embodiment of the present invention may include a capping layer 230 and a low refractive index layer 240. The capping layer 230 and the low refractive index layer 240 may be sequentially disposed between an OLED 210 and a first inorganic layer 311.

The low refractive index layer 240 may have a refractive index in a range of from about 1.3 to about 1.4. The low refractive index layer 240 may have a refractive index, for example, in a range of about 1.35 to about 1.39. For example, the low refractive index layer 240 may have a refractive index of about 1.37. The low refractive index layer 240 may provide a light emitted from the organic light-emitting layer 212 to be emitted to the outside.

The low refractive index layer 240 may include lithium fluoride (LiF).

Figure 10:
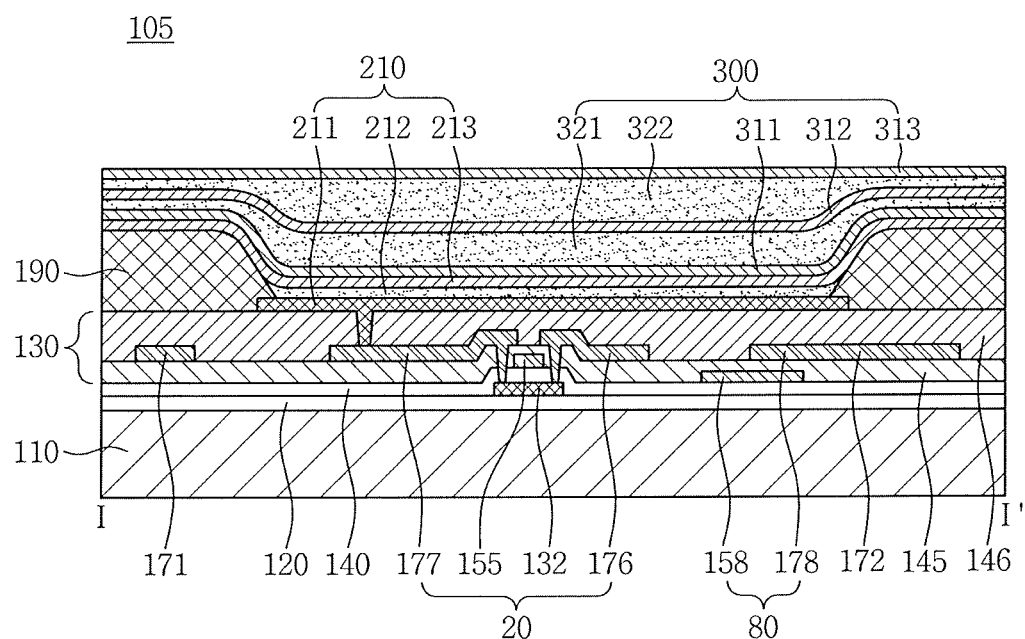
FIG. 10 is a cross-sectional view illustrating an OLED display device according to an exemplary embodiment of the present invention.

FIG. 10 is a cross-sectional view illustrating an OLED display device according to an exemplary embodiment of the present invention.

According to an exemplary embodiment of the present invention, a thin film encapsulation layer 300 may include a plurality of inorganic layers 311, 312 and 313 and a plurality of organic layers 321 and 322.

For example, the thin film encapsulation layer 300 described with reference to FIG. 10 includes three inorganic layers 311, 312 and 313 and two organic layers 321 and 322. The two organic layers 321 and 322 may be alternately arranged with the three inorganic layers 311, 312 and 313.

The three inorganic layers 311, 312 and 313 may be a first inorganic layer 311, a second inorganic layer 312 and a third inorganic layer 313, respectively. The two organic layers 321 and 322 may be named as a first organic layer 321 and a second organic layer 322, respectively.

In one or more exemplary embodiments of the present invention, the thin film encapsulation layer of the OLED display device may include an organic layer having a relatively high refractive index. Accordingly, a refractive index difference between the organic layer and the inorganic layer included in the thin film encapsulation layer may be reduced, and the light emission characteristics of the OLED display device may increase.

While the present invention has been illustrated and described with reference to the exemplary embodiments thereof, it will be apparent to those of ordinary skill in the art that various changes in form and detail may be made thereto without departing from the spirit and scope of the present invention.

What is claimed is:

1. A display device, comprising:
   a substrate;
   an organic light-emitting diode positioned above the substrate;
   a thin film encapsulation layer disposed on the organic light-emitting diode; and
   a capping layer disposed between the organic light-emitting diode and the thin film encapsulation layer, wherein the capping layer has a refractive index in a range from about 1.3 to about 1.4;
   wherein the thin film encapsulation layer comprises:
   at least one inorganic layer; and
   at least one organic layer disposed on the at least one inorganic layer,
   wherein the at least one organic layer has a refractive index of about 1.66 or greater.

2. The display device of claim 1, wherein the at least one inorganic layer and the at least one organic layer have a refractive index difference of about 0.06 or less.

3. The display device of claim 1, wherein the at least one organic layer has a refractive index in a range of from about 1.66 to about 2.8.

4. The display device of claim 1, wherein the at least one inorganic layer has a refractive index in a range of from about 1.6 to about 2.8.

5. The display device of claim 1, wherein the at least one organic layer is formed by polymerization of at least one monomer selected from: pentabromophenyl acrylate, 2-(9H-carbazol-9-yl) ethyl methacrylate, N-vinylcarbazole, bis (methacryloylthiophenyl) sulfide or zirconium acrylate.

6. The display device of claim 1, wherein the at least one organic layer comprises at least one of: poly(3,4-ethylene-dioxythiophene) (PEDOT), 4,4'-bis[N-(3-methylphenyl)-N-phenylamino]biphenyl (TPD), 4,4',4"-tris[(3-methylphenyl) phenylamino]triphenylamine (m-MTDATA), 1,3,5-tris [N,N-bis(2-methylphenyl)-amino]benzene (o-MTDAB), 1,3,5-tris[N,N-bis(3-methylphenyl)-amino]benzene (m-MTDAB), 1,3,5-tris [N,N-bis(4-methylphenyl)amino] benzene (p-MTDAB), 4,4'-bis[N,N-bis(3-methylphenyl)-amino]diphenylmethane (BPPM), 4,4-dicarbazolyl-1,1'-biphenyl (CBP), 4,4',4"-tris(N-carbazole) triphenylamine (TCTA), 2,2',2"-(1,3,5-benzenetolyl)tris-[1-phenyl-1H-benzoimidazol] (TPBI) or 3-(4-biphenyl)-4-phenyl-5-t-butyl-phenyl-1,2,4-triazole (TAZ).

7. The display device of claim 1, wherein the at least one inorganic layer comprises a first inorganic layer and a second inorganic layer, and
   the at least one organic layer comprises a first organic layer disposed between the first inorganic layer and the second inorganic layer.

8. The display device of claim 1, wherein the organic light-emitting diode comprises:
   a first electrode disposed on the substrate;
   an organic light-emitting layer disposed on the first electrode; and
   a second electrode disposed on the organic light-emitting layer.

9. The display device of claim 8, wherein the organic light-emitting diode comprises at least one of a hole injection layer and a hole transport layer disposed between the first electrode and the organic light-emitting layer.

10. The display device of claim 8, wherein the organic light-emitting diode comprises at least one of an electron transport layer and an electron injection layer disposed between the organic light-emitting layer and the second electrode.

11. The display device of claim 1, further comprising a low refractive index layer disposed between the capping layer and the thin film encapsulation layer.

12. The display device of claim 11, wherein the low refractive index layer has a refractive index in a range of from about 1.3 to about 1.4.

13. The display device of claim 11, wherein the low refractive index layer comprises lithium fluoride (LiF).

14. A display device, comprising:
   a substrate;
   an organic light-emitting diode positioned above the substrate;
   a thin film encapsulation layer disposed on the organic light-emitting diode; and
   a first light emission auxiliary layer positioned above the substrate,
   wherein the organic light-emitting diode comprises:
   a first electrode disposed on the substrate; and
   an organic light-emitting layer disposed on the first electrode,
   wherein the thin film encapsulation layer comprises:
   at least one inorganic layer; and
   at least one organic layer disposed on the at least one inorganic layer, wherein
   the at least one organic layer has a refractive index of about 1.66 or greater, and wherein the first light emission auxiliary layer is disposed between the first electrode and the organic light-emitting layer.

15. The display device of claim 14, wherein the organic light-emitting layer further comprises a second electrode disposed on the organic light-emitting layer.

16. The display device of claim 15, wherein the display device further comprises a second light emission auxiliary layer disposed between the organic light-emitting layer and the second electrode.

17. A display device, comprising:
a substrate;
an organic light-emitting diode positioned above the substrate:
a thin film encapsulation layer diposed on the organic light-emitting diode;
a capping layer disposed between the organic light-emitting diode and the thin film encapsulation layer, wherein the capping layer has a refractive index in a range from about 1.3 to 1.4;
a low refractive index layer disposed between the capping layer and the thin film encapsulation layer,
wherein the thin film encapsulation layer comprises:
at least two inorganic layers; and
at least two organic layers alternatingly disposed with the at least two inorganic layers,
wherein the at least two organic layer have a refractive index of about 1.66 or greater.

18. The display device of claim 17, wherein the at least two inorganic layers and the at least two organic layers have a refractive index difference of about 0.06 or less.

19. The display device of claim 17, wherein the low refractive index layer has a refractive index in a range of from about 1.3 to about 1.4.

* * * * *